(12) United States Patent
Chen et al.

(10) Patent No.: US 11,245,004 B2
(45) Date of Patent: Feb. 8, 2022

(54) MEMORY CELL WITH ISOLATED WELL REGION AND ASSOCIATED NON-VOLATILE MEMORY

(71) Applicant: eMemory Technology Inc., Hsin-Chu (TW)

(72) Inventors: Hsueh-Wei Chen, Hsinchu County (TW); Wei-Ren Chen, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 14 days.

(21) Appl. No.: 17/037,781

(22) Filed: Sep. 30, 2020

(65) Prior Publication Data

US 2021/0183998 A1 Jun. 17, 2021

Related U.S. Application Data

(60) Provisional application No. 62/946,432, filed on Dec. 11, 2019.

(51) Int. Cl.
| | |
|---|---|
| *H01L 27/105* | (2006.01) |
| *H01L 29/06* | (2006.01) |
| *H01L 29/792* | (2006.01) |
| *G11C 16/34* | (2006.01) |
| *H01L 29/423* | (2006.01) |
| *G11C 16/04* | (2006.01) |
| *H01L 27/11563* | (2017.01) |
| *G11C 16/10* | (2006.01) |
| *G11C 16/14* | (2006.01) |
| *G11C 16/26* | (2006.01) |
| *H01L 27/11524* | (2017.01) |
| *H01L 29/788* | (2006.01) |

(52) U.S. Cl.
CPC ...... *H01L 29/0653* (2013.01); *G11C 16/0425* (2013.01); *G11C 16/0466* (2013.01); *G11C 16/10* (2013.01); *G11C 16/14* (2013.01); *G11C 16/26* (2013.01); *G11C 16/34* (2013.01); *H01L 27/11524* (2013.01); *H01L 27/11563* (2013.01); *H01L 29/4234* (2013.01); *H01L 29/7885* (2013.01); *H01L 29/792* (2013.01)

(58) Field of Classification Search
CPC .......... H01L 27/1052; H01L 27/10844; H01L 27/11; H01L 27/112; H01L 27/115
See application file for complete search history.

(56) References Cited

U.S. PATENT DOCUMENTS 9,640,262 B2 5/2017 Hsu et al.

*Primary Examiner* — Mohammad M Choudhry
(74) *Attorney, Agent, or Firm* — WPAT, PC

(57) ABSTRACT

A non-volatile memory includes a substrate region, a barrier layer, an N-type well region, an isolation structure, a first gate structure, a first sidewall insulator, a first P-type doped region, a second P-type doped region and an N-type doped region. The isolation structure is arranged around the N-type well region and formed over the barrier layer. The N-type well region is surrounded by the isolation structure and the barrier layer. Consequently, the N-type well region is an isolation well region. The first gate structure is formed over a surface of the N-type well region. The first sidewall insulator is arranged around the first gate structure. The first P-type doped region, the second P-type doped region and the N-type doped region are formed under the surface of the N-type well region.

20 Claims, 10 Drawing Sheets

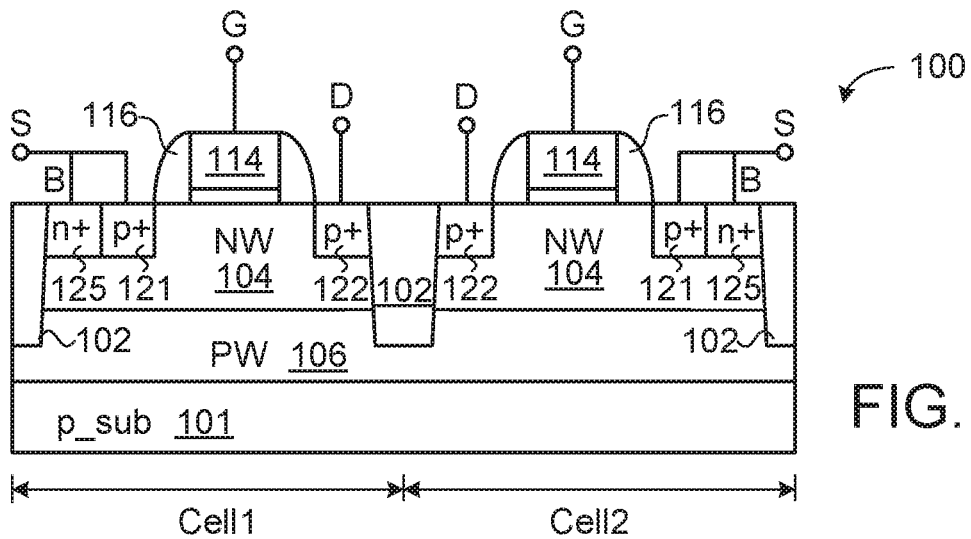
FIG. 1E
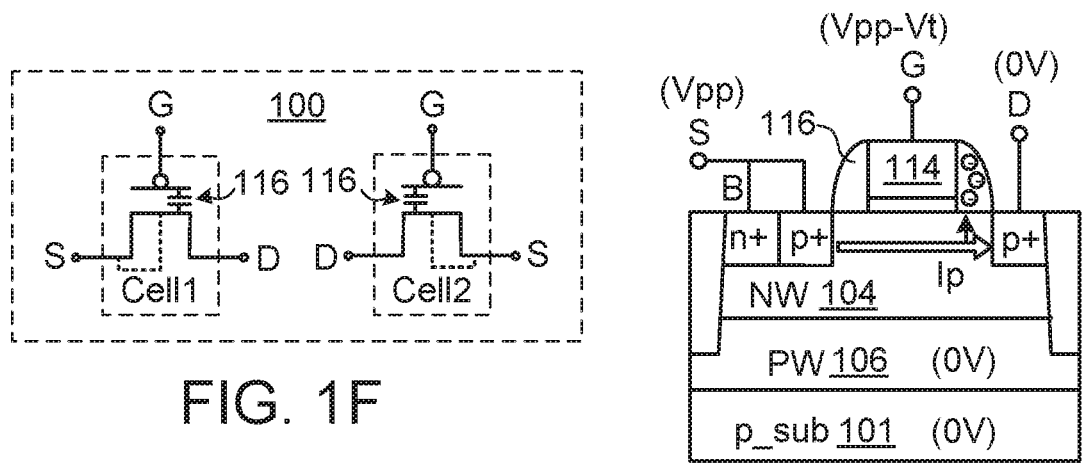
FIG. 1F
FIG. 2A
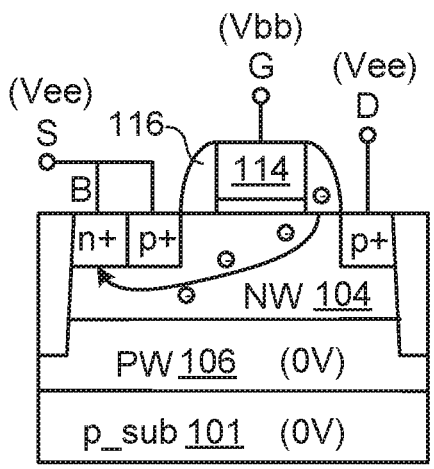
FIG. 2B
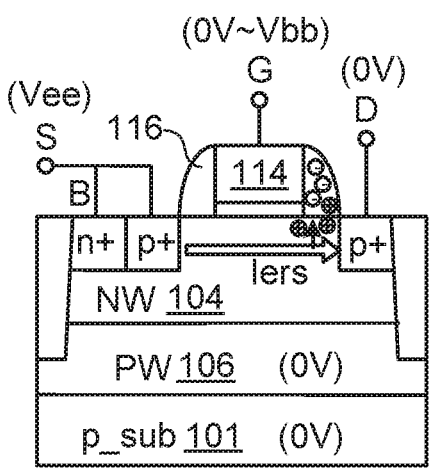
FIG. 2C

MEMORY CELL WITH ISOLATED WELL REGION AND ASSOCIATED NON-VOLATILE MEMORY

This application claims the benefit of U.S. provisional application Ser. No. 62/946,432, filed Dec. 11, 2019, the subject matter of which is incorporated herein by reference.

FIELD OF THE INVENTION

The present invention relates to a non-volatile memory (NVM), and more particularly to a memory cell with an isolated well region and an associated non-volatile memory.

BACKGROUND OF THE INVENTION

As known, a non-volatile memory can continuously record data after the power supply is interrupted. Consequently, the non-volatile memory has been widely used in various electronic devices. Generally, plural memory cells in the non-volatile memory are arranged as a memory cell array. Each memory cell comprises a floating gate transistor. Moreover, hot carriers can be stored in a floating gate of the floating gate transistor. By controlling the amount of hot carriers injected into the floating gate, a storage state of the memory cell can be determined. For example, the hot carriers are electrons.

Generally, the floating gate of the floating gate transistor is made of a conductive material (e.g., a polysilicon material). In the non-volatile memory, the floating gate of the floating gate transistor is not electrically connected to any part of the circuit. That is, the floating gate is in a floating state.

SUMMARY OF THE INVENTION

An embodiment of the present invention provides a non-volatile memory. The non-volatile memory includes a first memory cell. The first memory cell includes a substrate region, a barrier layer, an N-type well region, an isolation structure, a first gate structure, a first sidewall insulator, a first P-type doped region, a second P-type doped region and an N-type doped region. The barrier layer is formed over the substrate region. The N-type well region is formed over the barrier layer. The isolation structure is arranged around the N-type well region, and formed over the barrier layer. The isolation structure has a first depth. The N-type well region has a second depth. The second depth is smaller than the first depth. The N-type well region is surrounded by the isolation structure and the barrier layer. Consequently, the N-type well region is an isolated well region. The first gate structure is formed over a surface of the N-type well region. The first gate structure includes a first gate oxide layer and a first gate electrode layer. The first sidewall insulator is formed around the first gate structure. The first P-type doped region and the second P-type doped region are formed under the surface of the N-type well region, and located on two sides of the first sidewall insulator, respectively. The N-type doped region is formed under the surface of the N-type well region. The N-type well region, the first P-type doped region, the second P-type doped region, the N-type doped region and the first gate electrode layer are collaboratively formed as a first P-type transistor. A first gate terminal of the first P-type transistor is connected with the first gate electrode layer. A first source terminal of the first P-type transistor is connected with the first P-type doped region. A first drain terminal of the first P-type transistor is connected with the second P-type doped region. A first body terminal of the first P-type transistor is connected with the N-type doped region. The first source terminal of the first P-type transistor and the first body terminal of the first P-type transistor are connected with each other.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A-1E are schematic cross-sectional views illustrating a process of manufacturing memory cells of a non-volatile memory according to a first embodiment of the present invention;

FIG. 1F is a schematic equivalent circuit diagram of the memory cells of the non-volatile memory according to the first embodiment of the present invention;

FIGS. 2A-2E schematically illustrate the bias voltages for performing different actions on the memory cell according to the first embodiment of the present invention;

DETAILED DESCRIPTION OF PREFERRED EMBODIMENTS

The present invention provides a charge-trapping non-volatile memory. Each memory cell in the non-volatile memory is constructed in an isolated well. Moreover, each memory cell of the present invention is not equipped with a floating gate transistor.

FIGS. 1A-1E are schematic cross-sectional views illustrating a process of manufacturing memory cells of a non-volatile memory according to a first embodiment of the present invention. FIG. 1F is a schematic equivalent circuit diagram of the memory cells of the non-volatile memory according to the first embodiment of the present invention.

Figure 1A:
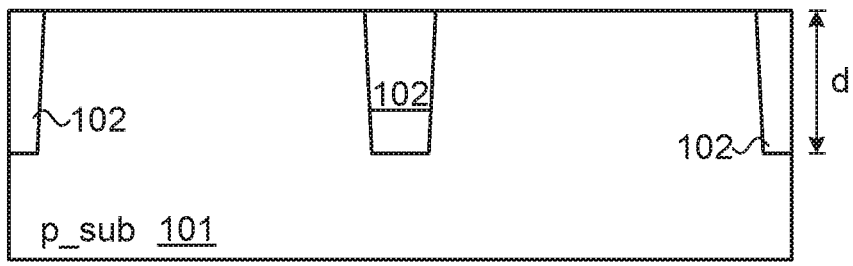

As shown in FIG. 1A, an isolation structure 102 with a depth d1 is formed under a p-type substrate (p_sub) 101 to define the regions of different memory cells. For example, the isolation structure 102 is a shallow trench isolation (STI) structure.

Figure 1B:
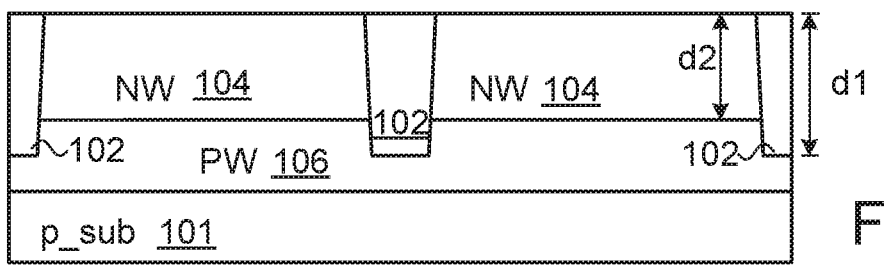
Figure 1C:
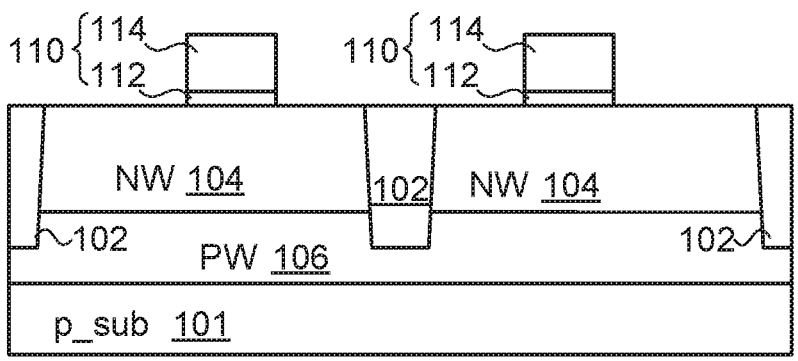

As shown in FIG. 1B, an N-type well region (NW) 104 and a P-type well region (PW) 106 are formed under the p-type substrate 101. The depth of the N-type well region (NW) 104 is d2, wherein d2 is smaller than d1. The P-type well region (PW) 106 is formed under the N-type well region (NW) 104. The P-type well region (PW) 106 may be considered as a barrier layer. Consequently, the N-type well region (NW) 104 surrounded by the isolation structure 102 and the P-type well region (PW) 106 is an isolated well region. As shown in FIG. 1C, a gate structure 110 is formed over the surface of the N-type well region (NW) 104. The gate structure 110 comprises a gate oxide layer 112 and a gate electrode layer 114.

Figure 1D:
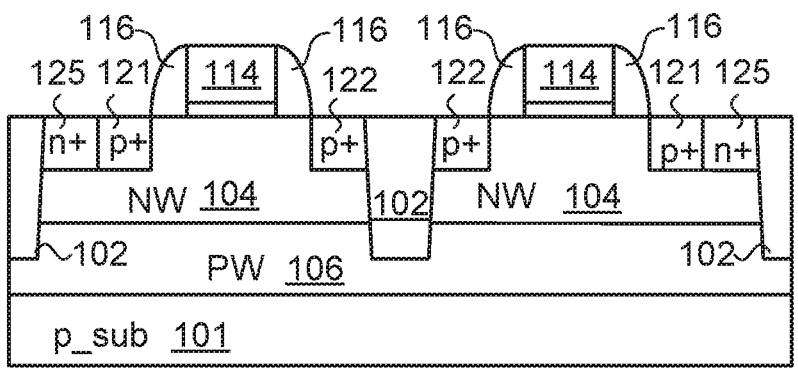

As shown in FIG. 1D, a sidewall insulator 116 is formed around the gate structure 110. For example, the sidewall insulator 116 is a spacer. The spacer is a silicon nitride spacer or a tri-layer oxide-nitride-oxide spacer.

Then, P-type doped regions (p+) 121 and 122 are formed under the surface of the N-type well region (NW) 104 and located on the two sides of the sidewall insulator 116. In addition, an N-type doped region (n+) 125 is formed under the surface of the N-type well region (NW) 104. For example, the N-type doped region (n+) 125 is formed beside the P-type doped region 121.

As shown in FIGS. 1E and 1F, A non-volatile memory 100 comprises two memory cells Cell1 and Cell2. Each memory cell is composed of a single P-type transistor. Consequently, each memory cell is also referred as a one-transistor memory cell (1T cell). The P-type transistor comprises the N-type well region (NW) 104, the P-type doped regions (p+) 121 and 122, the N-type doped region (n+) 125, the gate electrode layer 114 and the sidewall insulator 116. The gate electrode layer 114 is a gate terminal G of the P-type transistor. The P-type doped region 122 is a drain terminal D of the P-type transistor. The P-type doped region 121 is a source terminal S of the P-type transistor. The N-type doped region 125 is a body terminal B of the P-type transistor. The body terminal B and the source terminal S are connected with each other.

As mentioned above, the depth of the N-type well region (NW) 104 is smaller than the depth of the isolation structure 102, and the P-type well region (PW) 106 is formed under the N-type well region (NW) 104. In other word, the N-type well region (NW) 104 is the isolated well region, and each memory cell is constructed in the isolated well region. The isolated well regions of different memory cells are not in contact with each other. Consequently, the isolated well regions of different memory cells may receive different bias voltages. By providing proper bias voltages, hot carriers can be injected into or ejected from the sidewall insulator 116 of the P-type transistor. Consequently, the memory cell is in one of plural different storage state. For example, the hot carriers are electrons.

In other words, the sidewall insulator 116 is used as a trapping layer of the memory cell for storing the electrons. Consequently, the non-volatile memory (NVM) of the present invention is a charge-trapping non-volatile memory.

FIGS. 2A-2E schematically illustrate the bias voltages for performing different actions on the memory cell according to the first embodiment of the present invention.

Please refer to FIG. 2A. During a program action, the source terminal S of the P-type transistor receives a program voltage Vpp, the drain terminal D receives a ground voltage (0V), and the gate terminal G receives the first control voltage (Vpp−Vt). The P-type well region (PW) 106 and the P-type substrate (p_sub) receive the ground voltage (0V). For example, the program voltage Vpp is about 9V, the first control voltage is equal to about (Vpp−Vt), and Vt is a threshold voltage of the P-type transistor, wherein Vt is about 1.5V.

During the program action, the P-type transistor is turned on. Moreover, a program current Ip is generated between the source terminal S and the drain terminal D, and the program current Ip flows through a channel region of the P-type transistor. Due to a channel hot electron effect (also referred as a CHE effect), electrons are injected into one side of the sidewall insulator 116. For example, the electrons are injected into the sidewall insulator 116 on the drain side. Consequently, the memory cell is programmed to a first storage state.

Alternatively, during the program action, other bias voltages can be provided to the P-type transistor to control that the program current is not generated. Consequently, electrons cannot be injected into the sidewall insulator 116, and the memory cell is programmed to a second storage state. For example, in case that the drain terminal D is in the floating state, the ground voltage (0V) is provided to the source terminal (S), or the program voltage (Vpp) to the gate terminal G, the electrons cannot be injected into the sidewall insulator 116.

During an erase action, the electrons can be controlled to be ejected from the sidewall insulator 116, or the electrons can be neutralized with holes. Two examples of the erase action will be described as follows.

Please refer to FIG. 2B. During the erase action, the source terminal S and the drain terminal D of the P-type transistor receive an erase voltage Vee, the gate terminal G receives a second control voltage Vbb, and the P-type well region (PW) 106 and the P-type substrate (p_sub) receive the ground voltage (0V). For example, the erase voltage Vee is about 12V, and the second control voltage Vbb is a negative voltage, e.g., about −5V.

During the erase action, a Fowler-Nordheim tunneling effect (i.e., a FN tunneling effect) is generated in the region between the gate terminal G of the P-type transistor and the N-type well region (NW) 104. Due to the FN tunneling effect, the electrons are ejected from the sidewall insulator 116 to the N-type well region (NW) 104 and exited from the P-type transistor through the body terminal B.

Please refer to FIG. 2C. During the erase action, the source terminal S of the P-type transistor receives the erase voltage Vee, the drain terminal D receive the ground voltage (0V), the gate terminal G receives a third control voltage (0V~Vbb), and the P-type well region (PW) 106 and the P-type substrate (p_sub) receive the ground voltage (0V). For example, the third control voltage is in the range between 0V and the second control voltage Vbb, and the second control voltage Vbb is a negative voltage, e.g., about −5V.

During the erase action, the P-type transistor is turned on. An erase current Iers is generated between the source terminal S and the drain terminal D, and the erase current Iers flows through the channel region of the P-type transistor. Due to a channel hot hole effect (also referred as a CHH effect), the holes are injected into the sidewall insulator 116 to neutralize the electrons. Consequently, the memory cell is erased to the second storage state.

During a read action, the source terminal S of the P-type transistor receives a read voltage Vr, the drain terminal D receives the ground voltage (0V), the gate terminal G receives a fourth control voltage, and the P-type well region (PW) 106 and the P-type substrate (p_sub) receive the ground voltage (0V). For example, the read voltage Vr is about 3V, and the fourth control voltage is the ground voltage (0V).

Figure 2D:
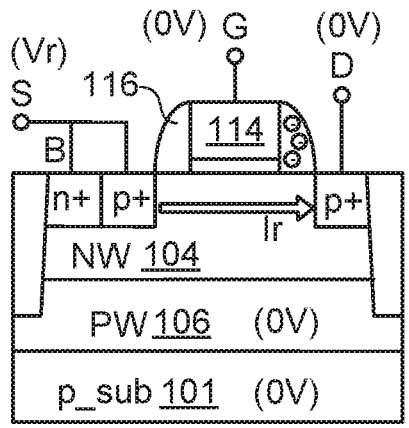

Please refer to FIG. 2D. During the read action, the P-type transistor is turned on. Since electrons are stored in the sidewall insulator 116, a read current Ir with a higher current value is generated between the source terminal S and the drain terminal D. The read current Ir flows through the channel region of the P-type transistor.

Figure 2E:
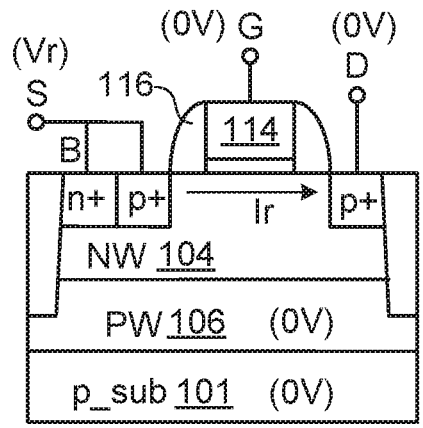

Please refer to FIG. 2E. During the read action, the P-type transistor is turned on. Since no electrons are stored in the sidewall insulator 116, a read current Ir with a lower current value is generated between the source terminal S and the drain terminal D. The read current Ir flows through the channel region of the P-type transistor.

Consequently, during the read action, the memory cell is determined to be in the first storage state or the second storage state according to the magnitude of the read current Ir generated by the memory cell.

It is noted that the voltage values of the program voltage Vpp, the erase voltage Vee, the read voltage Vr and the second control voltage Vbb are not restricted. That is, these voltage values may be varied according to the practical requirements.

It is noted that the structure of the memory cell is not restricted to the structure as shown in FIG. 1E. For example, the structure of the substrate region or the P-type well region (PW) 106 may be modified.

Figure 3A:
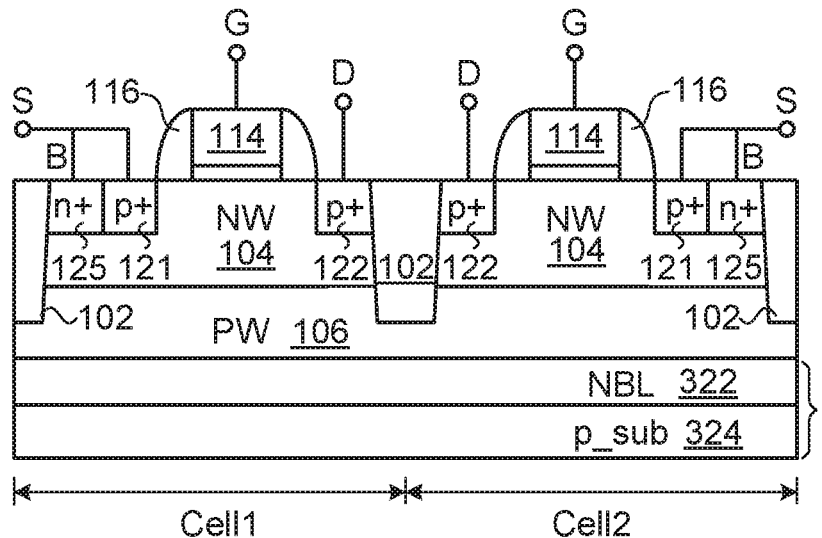
FIG. 3A is a schematic cross-sectional view illustrating a non-volatile memory with a substrate region and the structure of FIG. 1E.

FIG. 3A is a schematic cross-sectional view illustrating a non-volatile memory with a substrate region and the structure of FIG. 1E. As shown in FIG. 3A, the non-volatile memory 310 comprises a substrate region 320 and the structure as shown in FIG. 1E. The structure as shown in FIG. 1E is located over the substrate region 320. The substrate region 320 comprises a P-type substrate 324 and an N-type buried layer (NBL) 322. The N-type buried layer (NBL) 322 is arranged between the P-type well (PW) 106 and the P-type substrate (p_sub) 324.

Figure 3B:
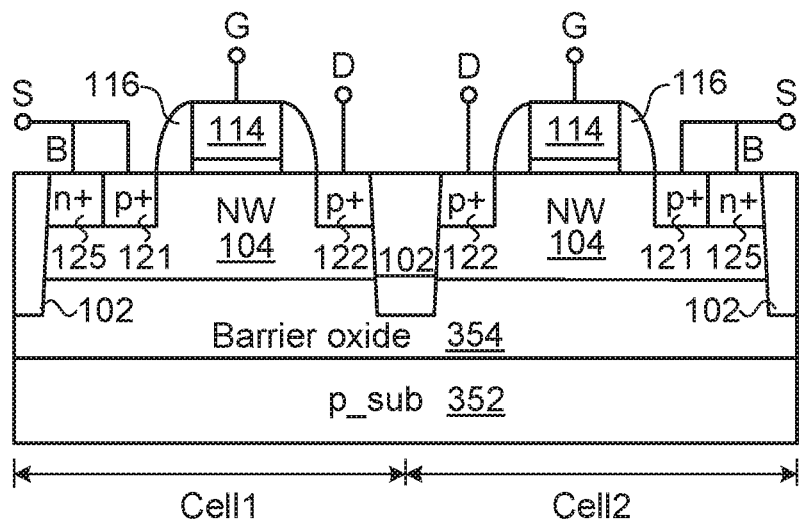
FIG. 3B is a schematic cross-sectional view illustrating a variant example of the non-volatile memory as shown in FIG. 3A.

FIG. 3B is a schematic cross-sectional view illustrating a variant example of the non-volatile memory as shown in FIG. 3A. In this embodiment, the substrate region of the non-volatile memory 350 is a silicon on insulator substrate (also referred as a SOI substrate).

The SOI substrate comprises a P-type substrate (p_sub) 352 and a barrier oxide layer 354. In other words, the P-type well region (PW) 106 as shown in FIG. 1E is replaced by the barrier oxide layer 354. Under this circumstance, the N-type well region (NW) 104 is surrounded by the barrier oxide layer 354 and the isolation structure 102. Consequently, the N-type well region (NW) 104 is an isolated well region. The structure over the barrier oxide layer 354 is similar to that of FIG. 1E, and not redundantly described herein.

Figure 4A:
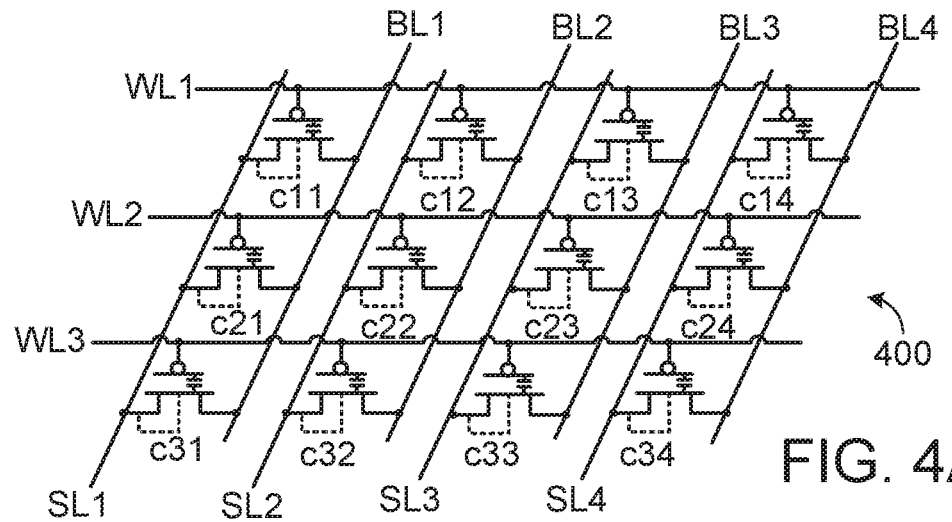
FIG. 4A is a schematic circuit diagram illustrating a memory cell array with plural memory cells of the first embodiment.

Moreover, plural memory cells of the first embodiment can be formed as a memory cell array. FIG. 4A is a schematic circuit diagram illustrating a memory cell array with plural memory cells of the first embodiment. The memory cell array 400 comprises m×n memory cells, wherein m and n are positive integers. For illustration, the memory cell array 400 of this embodiment comprises 3×4 memory cells c11~34. Each of the resistive memory cells c11~34 comprises a P-type transistor.

In the memory cell array 400, the gate terminals of the four memory cells c11~c14 in the first row are all connected with the word line WL1, the source terminals of the memory cells c11~c14 are respectively connected with the corresponding source lines SL1~SL4, and the drain terminals of the memory cells c11~c14 are respective connected with the corresponding bit lines BL1~BL4. The gate terminals of the four memory cells c21~c24 in the second row are all connected to with word line WL2, the source terminals of the memory cells c21~c24 are respectively connected with the corresponding source lines SL1~SL4, and the drain terminals of the memory cells c21~c24 are respectively connected with the corresponding bit lines BL1~BL4. The rest may be deduced by analogy.

Whenever the memory cell array 400 is enabled, one word line is activated. The row of the memory cell array 400 corresponding to the activated word line is referred as a selected row. The rows of the memory cell array 400 corresponding to the other word lines are unselected rows.

Similarly, for performing different actions, proper bias voltages as described in FIGS. 2A~2E may be provided to the memory cell array 400. For brevity, only the memory cells c11, c12, c21 and c22 will be described. The operations of the other memory cells are similar.

Figure 4B:
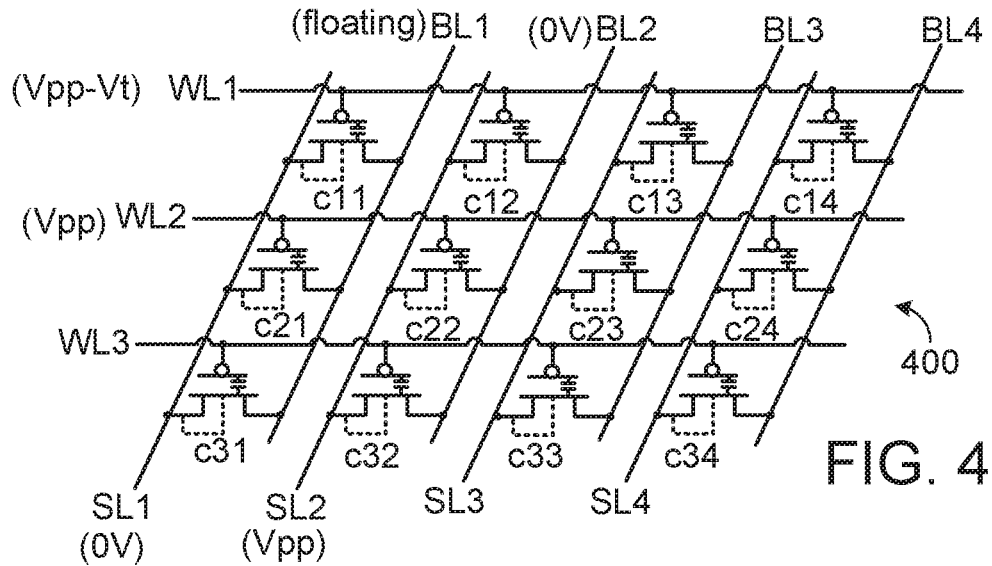
FIG. 4B schematically illustrates the bias voltages for performing a program action on the memory cell array as shown in FIG. 4A.

FIG. 4B schematically illustrates the bias voltages for performing a program action on the memory cell array as shown in FIG. 4A. During the program action, the word line WL1 receives the first control voltage (Vpp−Vt), the word line WL2 receives the program voltage (Vpp), the source line SL1 receives the ground voltage (0V), the source line SL2 receives the program voltage (Vpp), the bit line BL1 is in a floating state, and the bit line BL2 receives the ground voltage (0V). Consequently, in the memory cell array 400, the first row connected to the word line WL1 is the selected row, and the second row connected to the word line WL2 is the unselected row.

In the selected row, the source line SL1 receives the ground voltage (0V), and the bit line BL1 is in the floating state. Consequently, the memory cell c11 is the unselected cell, and no electrons are injected into the sidewall insulator of the memory cell c11. Under this circumstance, the memory cell c11 is in the second storage state. Moreover, the source line SL2 receives the program voltage (Vpp), and the bit line BL2 receives the ground voltage (0V). Consequently, the memory cell c12 is a selected cell, and electrons are injected into the sidewall insulator of the memory cell c12. Under this circumstance, the memory cell c12 is in the first storage state.

In the unselected row, the word line WL2 receives the program voltage (Vpp). The P-type transistors in the memory cells c21 and c22 cannot be turned on. Consequently, the memory cells c21 and 22 are unselected cells, and no electrons are injected into the sidewall insulator of the memory cells c21 and c22. Under this circumstance, the memory cells c21 and c22 are in the second storage state.

Figure 4C:
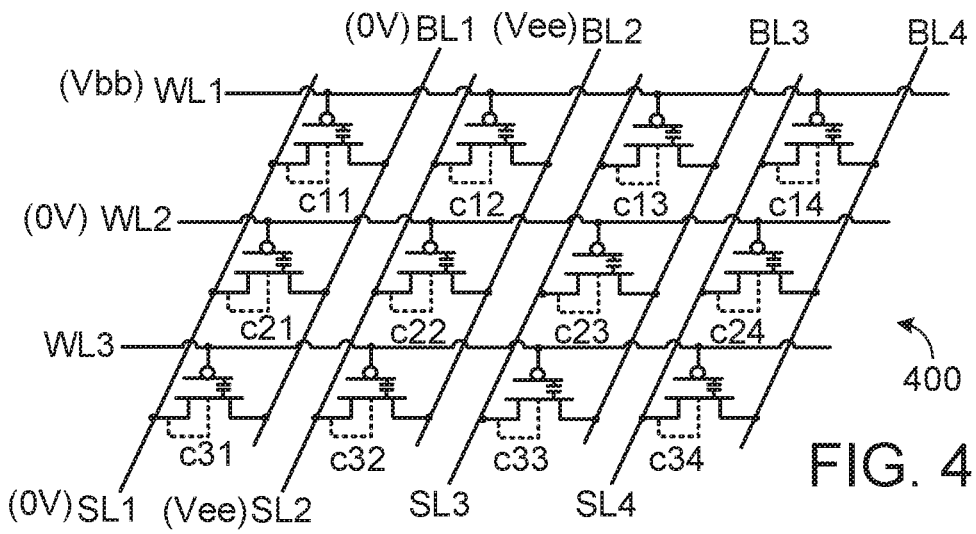
FIG. 4C schematically illustrates the bias voltages for performing an erase action on the memory cell array as shown in FIG. 4A through a FN effect.

FIG. 4C schematically illustrates the bias voltages for performing an erase action on the memory cell array as shown in FIG. 4A through a FN effect. During the erase action, the word line WL1 receives the second control voltage (Vbb), the word line WL2 receives the ground voltage (0V), the source line SL1 receives the ground voltage (0V), the source line SL2 receives the erase voltage (Vee), the bit line BL1 receives the ground voltage (0V), and the bit line BL2 receives the erase voltage (Vee). Consequently, in the memory cell array 400, the first row connected to the word line WL1 is the selected row, and the second row connected to the word line WL2 is the unselected row.

In the selected row, the source line SL1 receives the ground voltage (0V), and the bit line BL1 receives the ground voltage (0V). Consequently, the memory cell c11 is an unselected cell, and no electrons are ejected from the sidewall insulator of the memory cell c11. Moreover, the source line SL2 receives the erase voltage (Vee), and the bit line BL2 receives the erase voltage (Vee). Consequently, the memory cell c12 is a selected cell, and electrons are ejected from the sidewall insulator of the memory cell c12.

In the unselected column, the word line WL2 receives the ground voltage (0V). Consequently, the memory cells c21 and c22 are unselected cells, and no electrons are ejected from the sidewall insulators of the memory cells c21 and c22.

Figure 4D:
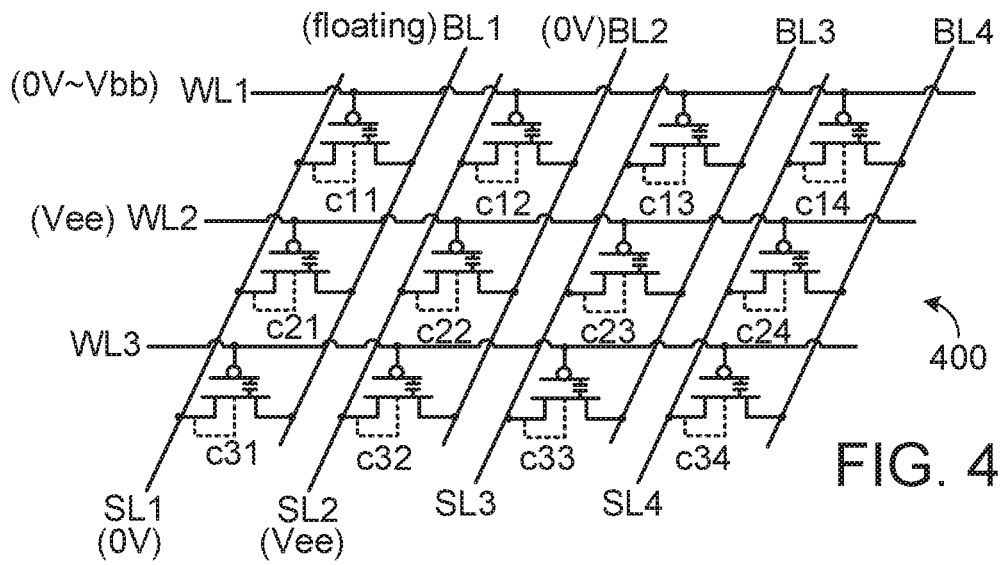
FIG. 4D schematically illustrates the bias voltages for performing an erase action on the memory cell array as shown in FIG. 4A through a CHH effect.

FIG. 4D schematically illustrates the bias voltages for performing an erase action on the memory cell array as shown in FIG. 4A through a CHH effect. During the erase action, the word line WL1 receives the third control voltage (0V~Vbb), the word line WL2 receives the erase voltage (Vee), the source line SL1 receives the ground voltage (0V), the source line SL2 receives the erase voltage (Vee), the bit line BL1 is in a floating state, and the bit line BL2 receives the ground voltage (0V). Consequently, in the memory cell array 400, the first row connected to the word line WL1 is the selected row, and the second row connected to the word line WL2 is the unselected row.

In the selected row, the source line SL1 receives the ground voltage (0V), and the bit line BL1 is in a floating state. Consequently, the memory cell c11 is an unselected cell, and no holes are injected into the sidewall insulator of the memory cell c11. Moreover, the source line SL2 receives the erase voltage (Vee), and the bit line BL2 receives the ground voltage (0V). Consequently, the memory cell c12 is a selected cell, and holes are injected into the sidewall insulator of the memory cell c12.

In the unselected row, the word line WL2 receives the erase voltage (Vee). Consequently, the memory cells c21 and c22 are unselected cells, and no holes are injected into the sidewall insulators of the memory cell c21 and c22.

As mentioned above, each memory cell has an isolated well region. During the erase action as shown in FIGS. 4C and 4D, a specified memory cell in the selected row of the memory cell array 400 is the selected cell, and the erase action is performed on the selected cell. In other words, the erase action can be performed on all memory cells or a single memory cell of the selected row of the memory cell array 400.

Figure 4E:
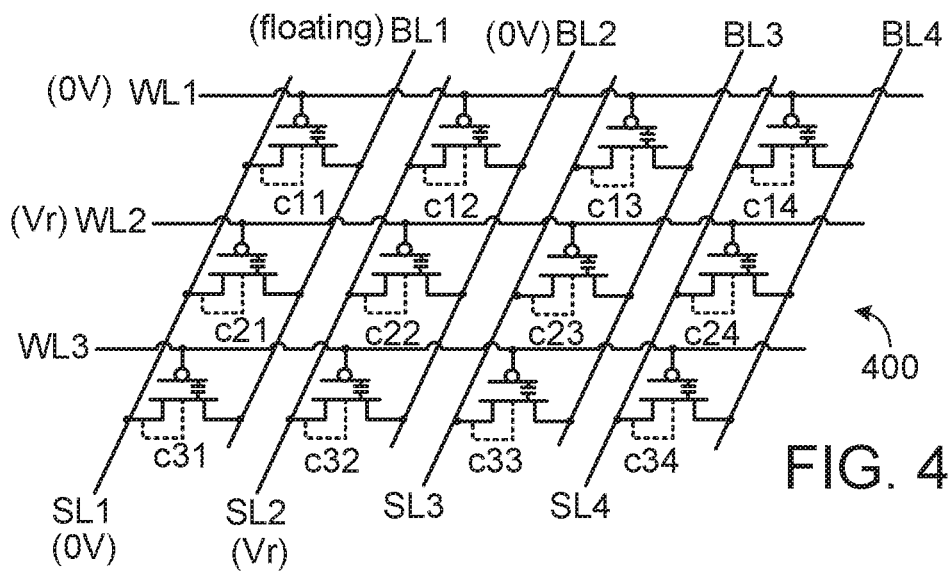
FIG. 4E schematically illustrates the bias voltages for performing a read action on the memory cell array as shown in FIG. 4A.

FIG. 4E schematically illustrates the bias voltages for performing a read action on the memory cell array as shown in FIG. 4A. During the read action, the word line WL1 receives the fourth control voltage (0V), the word line WL2 receives the read (Vr), the source line SL1 receives the ground voltage (0V), the source line SL2 receives the read voltage (Vr), the bit line BL1 is in the floating state, and the bit line BL2 receives the ground voltage (0V). Consequently, in the memory cell array 400, the first row connected to the word line WL1 is the selected row, and the second row connected to the word line WL2 is the unselected row.

In the selected row, the source line SL1 receives the ground voltage (0V), and the bit line BL1 is in the floating state. Consequently, the memory cell c11 is an unselected cell, and no read current is generated by the memory cell c11. Moreover, the source line SL2 receives the read voltage Vr, and the bit line BL2 receives the ground voltage (0V). Consequently, the memory cell c12 is the selected cell and generates a read current.

In the unselected row, the word line WL2 receives the read voltage Vr. Consequently, the memory cells c21 and c22 are unselected cells, and no read current is generated by the memory cells c21 and c22.

Figure 5:
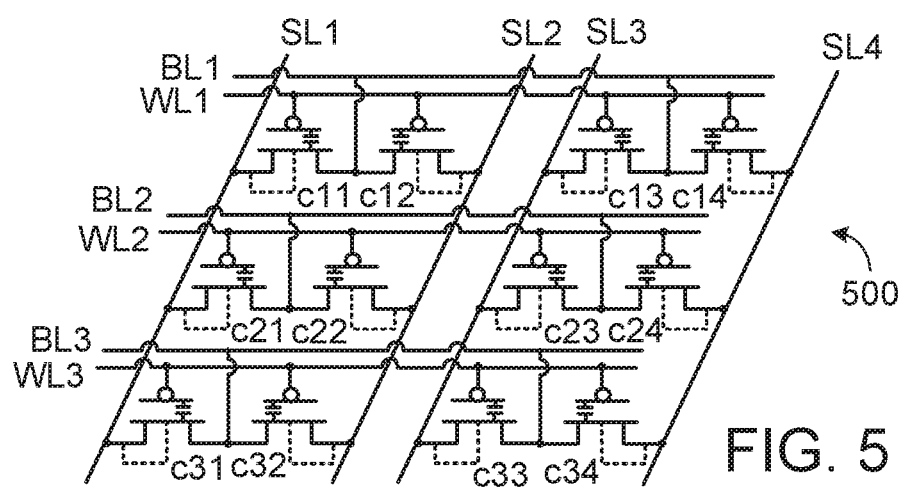
FIG. 5 is a schematic circuit diagram illustrating a variant example of the memory cell array with plural memory cells of the first embodiment.

FIG. 5 is a schematic circuit diagram illustrating a variant example of the memory cell array with plural memory cells of the first embodiment. The memory cell array 500 comprises m×n memory cells, wherein m and n are positive integers. For illustration, the memory cell array 500 of this embodiment comprises 3×4 memory cells c11~34. Each of the resistive memory cells c11~34 comprises a P-type transistor.

In the memory cell array 500, the gate terminals of the four memory cells c11~c14 in the first row are all connected with the word line WL1, the source terminals of the memory cells c11~c14 are respectively connected with the corresponding source lines SL1~SL4, the drain terminals of the first pair of memory cells c11 and c12 in the first row are connected with the bit line BL1, and the drain terminals of the second pair of memory cells c13 and c14 in the first row are connected with the bit line BL2. The gate terminals of the four memory cells c21~c24 in the second row are all connected to with word line WL2, the source terminals of the memory cells c21~c24 are respectively connected with the corresponding source lines SL1~SL4, the drain terminals of the first pair of memory cells c21 and c22 in the second row are connected with the bit line BL1, and the drain terminals of the second pair of memory cells c23 and c24 in the second row are connected with the bit line BL2. The rest may be deduced by analogy.

Whenever the memory cell array 500 is enabled, one word line is activated. The row of the memory cell array 500 corresponding to the activated word line is referred as a selected row. The rows of the memory cell array 500 corresponding to the other word lines are unselected rows. By providing proper bias voltages to the word lines WL1~WL3, the source lines SL1~SL4 and the bit lines BL1~BL2, the program action, the erase action and the read action can be performed on specific memory cells in the memory cell array 500. Similarly, for performing different actions, proper bias voltages as described in FIGS. 2A-2E may be provided to the memory cell array 500.

Figure 6A:
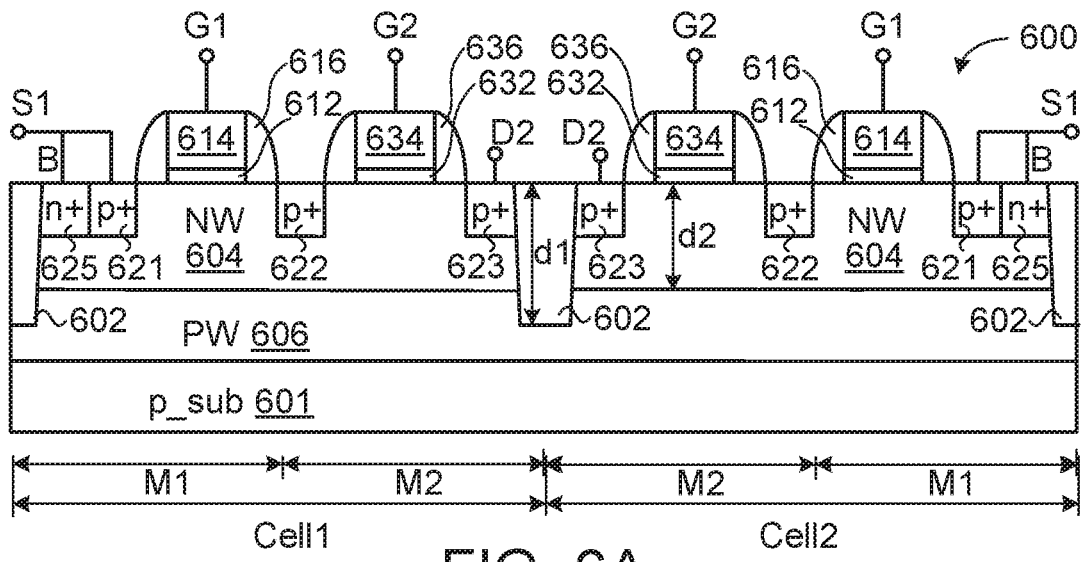
FIG. 6A is schematic cross-sectional view illustrating memory cells of a non-volatile memory according to a second embodiment of the present invention.
Figure 6B:
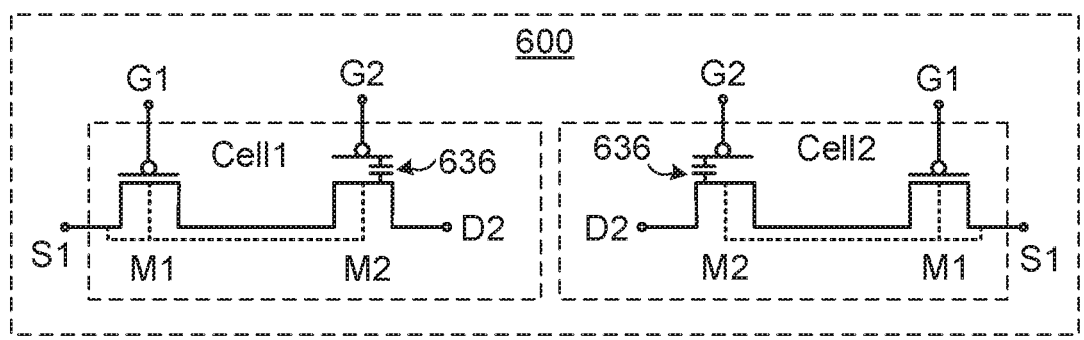
FIG. 6B is a schematic equivalent circuit diagram of the memory cells of the non-volatile memory according to the second embodiment of the present invention.

FIG. 6A is schematic cross-sectional view illustrating memory cells of a non-volatile memory according to a second embodiment of the present invention. FIG. 6B is a schematic equivalent circuit diagram of the memory cells of the non-volatile memory according to the second embodiment of the present invention. The process of manufacturing the memory cells of this embodiment is similar to that of the first embodiment, and not redundantly described herein.

As shown in FIG. 6A, the non-volatile memory 600 comprises two memory cells Cell1 and Cell2. The two memory cells Cell1 and Cell2 have the same structure. The memory cell Cell1 comprises a substrate region (p_sub) 601, a P-type well region (PW) 606, an N-type well region (NW) and an isolation structure 602. The P-type well region (PW) 606 is formed over the substrate region (p_sub) 601. The N-type well region (NW) 604 is formed over the P-type well region (PW) 606. The isolation structure 602 is arranged around the N-type well region (NW) 604 and formed over the P-type well region (PW) 606. The depth of the isolation structure 602 is d1, and the depth of the N-type well region (NW) 604 is d2, wherein d2 is smaller than d1. The P-type well region (PW) 606 may be considered as a barrier layer. Consequently, the N-type well region (NW) 604 is surrounded by the isolation structure 602 and the barrier layer, and the N-type well region (NW) 604 is an isolated well region.

The memory cell Cell1 further comprises two gate structures, and the two gate structures are formed over the surface of the N-type well region (NW) 604. The first gate structure comprises a gate oxide layer 612 and a gate electrode layer 614. The second gate structure comprises a gate oxide layer 632 and a gate electrode layer 634. A sidewall insulator 616 is formed around the first gate structure. A sidewall insulator 636 is formed around the second gate structure. For example, the sidewall insulators 616 and 636 are spacers. The spacer is a silicon nitride spacer or a tri-layer oxide-nitride-oxide spacer.

The memory cell Cell1 further comprises three P-type doped regions (p+) 621, 622, 623 and an N-type doped region (n+) 625, which are all formed under the surface of the N-type well region (NW) 604. The P-type doped regions (p+) 623 and 622 are located on the two sides of the sidewall insulator 636. The P-type doped regions (p+) 622 and 621 are located on the two sides of the sidewall insulator 616. In addition, an N-type doped region (n+) 625 is formed under the surface of the N-type well region (NW) 604. For example, the N-type doped region (n+) 625 is formed beside the P-type doped region 621.

As shown in FIGS. 6A and 6B, each memory cell of the non-volatile memory 600 comprises two P-type transistors M1 and M2. Consequently, each memory cell is also referred as a two-transistor memory cell (2T cell). The first P-type transistor M1 comprises the N-type well region (NW) 604, the P-type doped regions (p+) 622 and 621, the N-type doped region (n+) 625 and the gate electrode layer 614. The second P-type transistor M2 comprises the N-type well region (NW) 604, the P-type doped regions (p+) 623 and 622, the N-type doped region (n+) 625 and the gate electrode layer 634.

The gate electrode layer 614 is a gate terminal G1 of the first P-type transistor M1. The P-type doped region (p+) 622 is a drain terminal of the first P-type transistor M1. The P-type doped region (p+) 621 is a source terminal S1 of the first P-type transistor M1. The N-type doped region (n+) 625 is a body terminal B of the first P-type transistor M1. The gate electrode layer 634 is a gate terminal G2 of the second P-type transistor M2. The P-type doped region (n+) 623 is a drain terminal D2 of the second P-type transistor M2. The P-type doped region (p+) 622 is a source terminal of the second P-type transistor M2. The N-type doped region (n+) 625 is a body terminal B of the second P-type transistor M2. The body terminal B of the first P-type transistor M1 and the body terminal B of the second transistor M2 are both connected with the source terminal S1 of the first transistor M1.

In this embodiment, each memory cell is constructed in the isolated well region. Consequently, the isolated well regions of different memory cells may receive different bias voltages. By providing proper bias voltages, hot carriers can be injected into or ejected from the sidewall insulator 636 of the second P-type transistor M2. Consequently, the memory cell is in one of plural different storage state. For example, the hot carriers are electrons.

In other words, the sidewall insulator 636 is used as a trapping layer of the memory cell for storing the electrons. Consequently, the non-volatile memory (NVM) of the present invention is a charge-trapping non-volatile memory.

FIGS. 7A-7E schematically illustrate the bias voltages for performing different actions on the memory cell according to the second embodiment of the present invention.

Figure 7A:
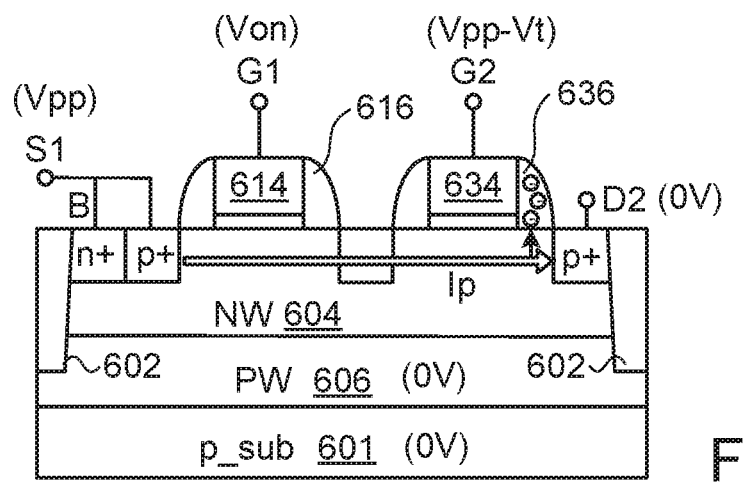
FIGS. 7A-7E schematically illustrate the bias voltages for performing different actions on the memory cell according to the second embodiment of the present invention.

Please refer to FIG. 7A. During a program action, the source terminal S1 of the first P-type transistor M1 receives a program voltage (Vpp), the drain terminal D2 of the second P-type transistor M2 receives a ground voltage (0V), the gate terminal G1 receives an on voltage (Von), the gate terminal G2 receives a first control voltage (Vpp−Vt), and the P-type well region (PW) 606 and the P-type substrate (p_sub) 601 receive the ground voltage (0V). For example, the program voltage Vpp is about 9V, on voltage (Von) is the ground voltage (0V), the first control voltage is equal to about (Vpp−Vt), and Vt is a threshold voltage of the P-type transistor, wherein Vt is about 1.5V.

During the program action, the first P-type transistor M1 and the second P-type transistor M2 are turned on. Moreover, a program current Ip is generated between the source terminal S1 of the first P-type transistor M1 and the drain terminal D2 of the second transistor M2. Due to a channel hot electron effect (also referred as a CHE effect), electrons are injected into one side of the sidewall insulator 636. For example, the electrons are injected into the sidewall insulator 636 on the drain side of the second P-type transistor M2. Consequently, the memory cell is programmed to a first storage state.

Alternatively, during the program action, other bias voltages can be provided to the first P-type transistor M1 and the second P-type transistor M2 to control that the program current is not generated. Consequently, electrons cannot be injected into the sidewall insulator 636, and the memory cell is programmed to a second storage state. For example, in case that the drain terminal D is in the floating state, the ground voltage (0V) is provided to the source terminal, or the program voltage (Vpp) to the gate terminal, the electrons cannot be injected into the sidewall insulator 636.

During an erase action, the electrons can be controlled to be ejected from the sidewall insulator 636, or the electrons can be neutralized with holes. Two examples of the erase action will be described as follows.

Figure 7B:
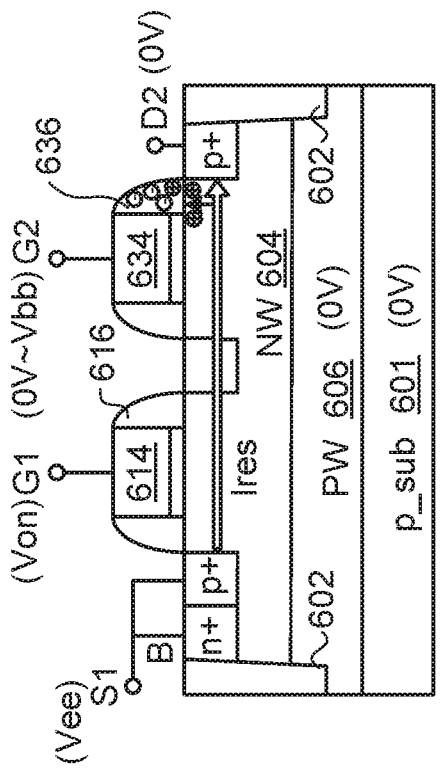

Please refer to FIG. 7B. During the erase action, the source terminal S1 of the first P-type transistor M1 and the drain terminal D2 of the second P-type transistor M2 receive the erase voltage Vee, the gate terminal G1 and the gate terminal G2 receive a second control voltage Vbb, and the P-type well region (PW) 606 and the P-type substrate (p_sub) 601 receive the ground voltage (0V). For example, the erase voltage Vee is about 12V, and the second control voltage Vbb is a negative voltage, e.g., about −5V.

During the erase action, a Fowler-Nordheim tunneling effect (i.e., a FN tunneling effect) is generated in the region between the gate terminal G2 of the second P-type transistor M2 and the N-type well region (NW) 604. Due to the FN tunneling effect, the electrons are ejected from the sidewall insulator 636 to the N-type well region (NW) 604 and exited from the second P-type transistor M2 through the body terminal B.

Figure 7C:
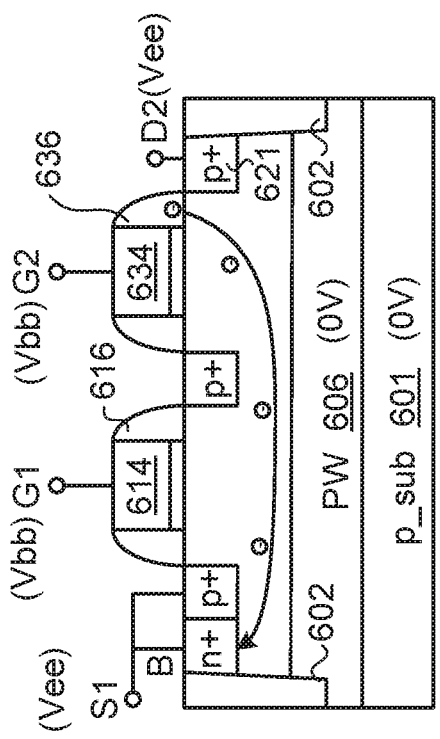

Please refer to FIG. 7C. During the erase action, the source terminal S1 of the first P-type transistor M1 receives the erase voltage Vee, the drain terminal D2 of the second P-type transistor M2 receives the ground voltage (0V), the gate terminal G1 of the first P-type transistor M1 receives the on voltage (Von), the gate terminal G2 of the second P-type transistor M2 receives a third control voltage (0V~Vbb), and the P-type well region (PW) 606 and the P-type substrate (p_sub) 601 receive the ground voltage (0V). For example, the on voltage (Von) is the ground voltage (0V), the third control voltage is in the range between 0V and the second control voltage Vbb, and the second control voltage Vbb is a negative voltage, e.g., about −5V.

During the erase action, the first P-type transistor M1 and the second P-type transistor M2 are turned on. An erase current Iers is generated between the source terminal S1 of the first P-type transistor M1 and the drain terminal D2 of the second P-type transistor M2. Due to a channel hot hole effect (also referred as a CHH effect), the holes are injected into the sidewall insulator 636 to neutralize with the electrons. Consequently, the memory cell is erased to the second storage state.

During a read action, the source terminal S1 of the first P-type transistor M1 receives the read voltage Vr, the drain terminal D2 of the second P-type transistor M2 receives the ground voltage (0V), the gate terminal G1 of the first P-type transistor M1 receives the on voltage (Von), the gate terminal G2 of the second P-type transistor M2 receives a fourth control voltage, and the P-type well region (PW) 606 and the P-type substrate (p_sub) 601 receive the ground voltage (0V). For example, the on voltage (Von) is the ground voltage (0V), the fourth control voltage is the ground voltage (0V), and the read voltage Vr is about 3V.

Figure 7D:
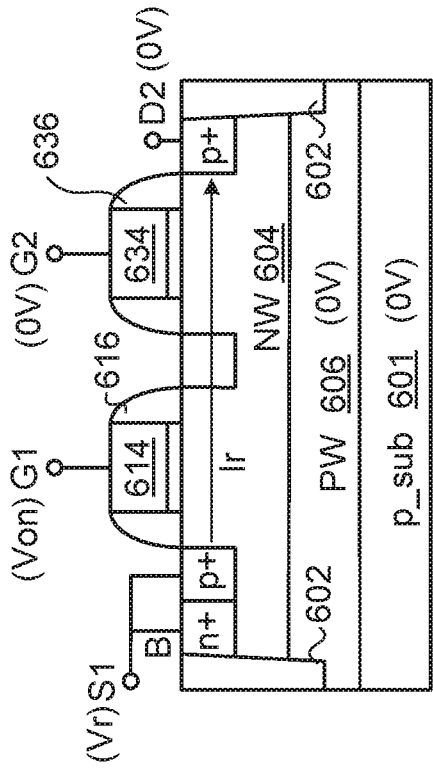

Please refer to FIG. 7D. During the read action, the first P-type transistor M1 and the second P-type transistor M2 are turned on. Since electrons are stored in the sidewall insulator 636, a read current Ir with a higher current value is generated between the source terminal S1 of the first P-type transistor M1 and the drain terminal D2 of the second P-type transistor M2.

Figure 7E:
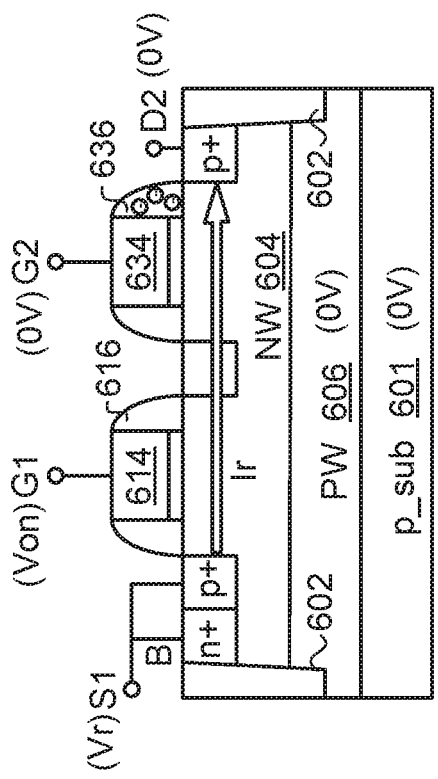

Please refer to FIG. 7E. During the read action, the first P-type transistor M1 and the second P-type transistor M2 are turned on. Since no electrons are stored in the sidewall insulator 636, a read current Ir with a lower current value is generated between the source terminal S1 of the first P-type transistor M1 and the drain terminal D2 of the second P-type transistor M2.

Consequently, during the read action, the memory cell is determined to be in the first storage state or the second storage state according to the magnitude of the read current Ir generated by the memory cell.

It is noted that the voltage values of the program voltage Vpp, the erase voltage Vee, the read voltage Vr and the second control voltage Vbb are not restricted. That is, these voltage values may be varied according to the practical requirements.

It is noted that the structure of the memory cell is not restricted to the structure as shown in FIG. 6A. For example, the structure of the substrate region or the P-type well region (PW) 606 may be modified by referring to the example of FIGS. 3A and 3B.

Figure 8:
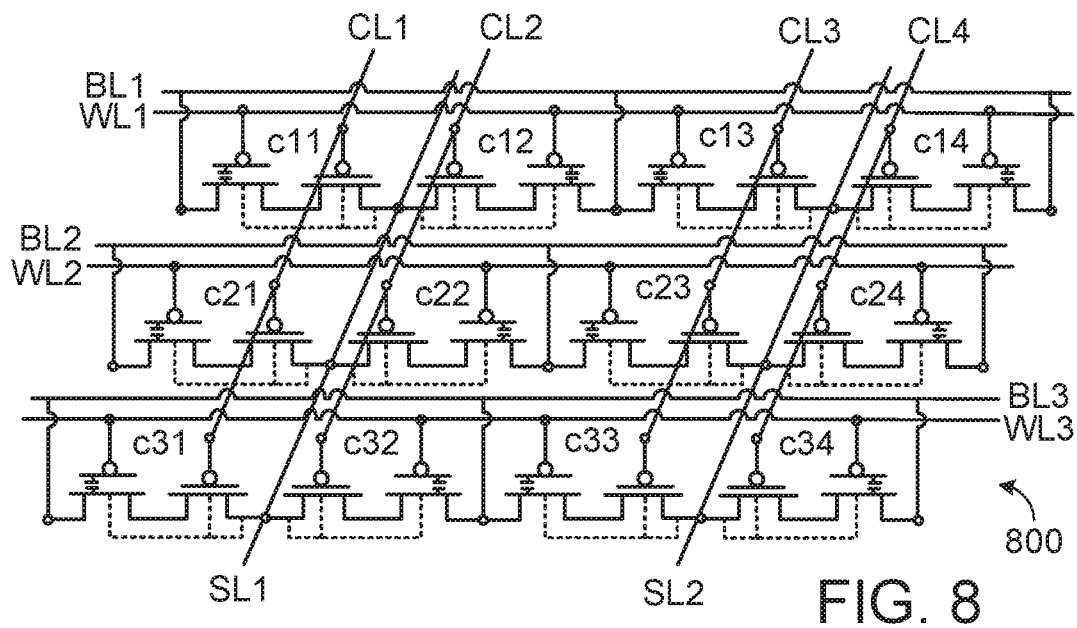
FIG. 8 is a schematic circuit diagram illustrating a memory cell array with plural memory cells of the second embodiment.

Moreover, plural memory cells of the second embodiment can be formed as a memory cell array. FIG. 8 is a schematic circuit diagram illustrating a memory cell array with plural memory cells of the second embodiment. The memory cell array 800 comprises m×n memory cells, wherein m and n are positive integers. For illustration, the memory cell array 800 of this embodiment comprises 3×4 memory cells c11~34. Each of the resistive memory cells c11~34 comprises a first P-type transistor and a second P-type transistor.

In the memory cell array 800, the gate terminals of the second P-type transistors in the four memory cells c11~c14 in the first row are all connected with the word line WL1, the drain terminals of the second P-type transistors in the memory cells c11~c14 are all connected with the bit line BL1, the gate terminals of the first P-type transistors in the memory cells c11~c14 are respectively connected with the corresponding control lines CL1~CL4, the source terminals of the first P-type transistors in the first pair of memory cells c11 and c12 are connected with the source line SL1, and the source terminals of the first P-type transistors in the second pair of memory cells c13 and c14 are connected with the source line SL2. The gate terminals of the second P-type transistors in the four memory cells c21~c24 in the second row are all connected with the word line WL2, the drain terminals of the second P-type transistors in the memory cells c21~c24 are all connected with the bit line BL2, the gate terminals of the first P-type transistors in the memory cells c21~c24 are respectively connected with the corresponding control lines CL1~CL4, the source terminals of the first P-type transistors in the first pair of memory cells c21 and c22 are connected with the source line SL1, and the source terminals of the first P-type transistors in the second pair of memory cells c23 and c24 are connected with the source line SL2. The rest may be deduced by analogy.

Whenever the memory cell array 800 is enabled, one word line is activated. The row of the memory cell array 800 corresponding to the activated word line is referred as a selected row. The rows of the memory cell array 800 corresponding to the other word lines are unselected rows. Similarly, for performing the program action, the erase action or the read action, proper bias voltages as described in FIGS. 7A-7E may be provided to the memory cell array 800.

Figure 9A:
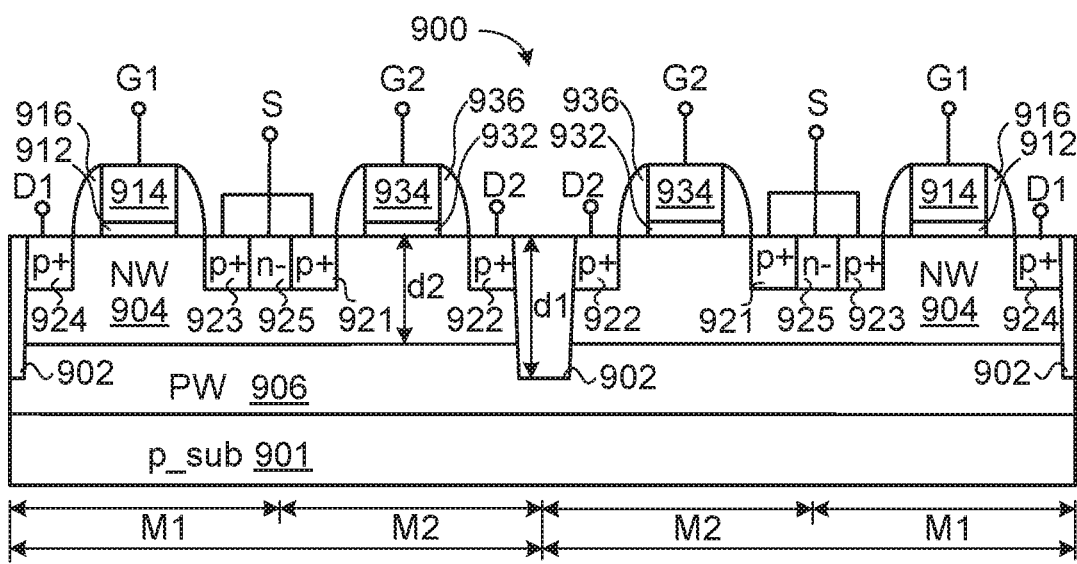
FIG. 9A is schematic cross-sectional view illustrating memory cells of a non-volatile memory according to a third embodiment of the present invention.
Figure 9B:
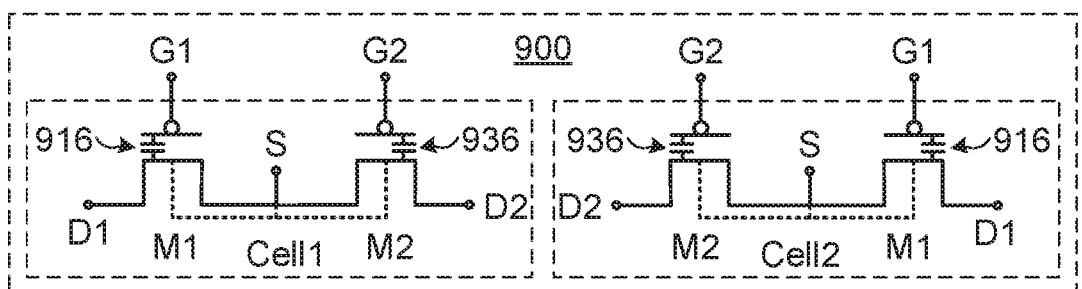
FIG. 9B is a schematic equivalent circuit diagram of the memory cells of the non-volatile memory according to the third embodiment of the present invention.

FIG. 9A is schematic cross-sectional view illustrating memory cells of a non-volatile memory according to a third embodiment of the present invention. FIG. 9B is a schematic equivalent circuit diagram of the memory cells of the non-volatile memory according to the third embodiment of the present invention. In this embodiment, the memory cell is a differential memory cell. The process of manufacturing the memory cells of this embodiment is similar to that of the first embodiment and the second embodiment, and not redundantly described herein.

As shown in FIG. 9A, the non-volatile memory 900 comprises two memory cells Cell1 and Cell2. The two memory cells Cell1 and Cell2 have the same structure. The memory cell Cell1 comprises a substrate region (p_sub) 901, a P-type well region (PW) 906, an N-type well region (NW) and an isolation structure 902. The P-type well region (PW)

906 is formed over the substrate region (p_sub) 901. The N-type well region (NW) 904 is formed over the P-type well region (PW) 906. The isolation structure 902 is arranged around the N-type well region (NW) 904 and formed over the P-type well region (PW) 906. The depth of the isolation structure 902 is d1, and the depth of the N-type well region (NW) 904 is d2, wherein d2 is smaller than d1. The P-type well region (PW) 906 may be considered as a barrier layer. Consequently, the N-type well region (NW) 904 is surrounded by the isolation structure 902 and the barrier layer, and the N-type well region (NW) 904 is an isolated well region.

The memory cell Cell1 further comprises two gate structures, and the two gate structures are formed over the surface of the N-type well region (NW) 904. The first gate structure comprises a gate oxide layer 912 and a gate electrode layer 914. The second gate structure comprises a gate oxide layer 932 and a gate electrode layer 934. A sidewall insulator 916 is formed around the first gate structure. A sidewall insulator 936 is formed around the second gate structure. For example, the sidewall insulators 916 and 936 are spacers. The spacer is a silicon nitride spacer or a tri-layer oxide-nitride-oxide spacer.

The memory cell Cell1 further comprises four P-type doped regions (p+) 921, 922, 923, 924 and an N-type doped region (n+) 925, which are all formed under the surface of the N-type well region (NW) 904. The P-type doped regions (p+) 921 and 922 are located on the two sides of the sidewall insulator 936. The P-type doped regions (p+) 923 and 924 are located on the two sides of the sidewall insulator 916. In addition, an N-type doped region (n+) 925 is formed under the surface of the N-type well region (NW) 904. For example, the N-type doped region (n+) 925 is arranged between the P-type doped regions (p+) 921 and 923.

As shown in FIGS. 9A and 9B, each memory cell of the non-volatile memory 900 comprises two P-type transistors M1 and M2. Consequently, each memory cell is also referred as a two-transistor memory cell (2T cell). The first P-type transistor M1 comprises the N-type well region (NW) 904, the P-type doped regions (p+) 923 and 924, the N-type doped region (n+) 925 and the gate electrode layer 914. The second P-type transistor M2 comprises the N-type well region (NW) 904, the P-type doped regions (p+) 921 and 922, the N-type doped region (n+) 925 and the gate electrode layer 934.

The gate electrode layer 914 is a gate terminal G1 of the first P-type transistor M1, the P-type doped region (p+) 924 is a drain terminal D1 of the first P-type transistor M1, the P-type doped region (p+) 923 is a source terminal S of the first P-type transistor M1, the N-type doped region (n+) 925 is a body terminal B of the first P-type transistor M1. The gate electrode layer 934 is a gate terminal G2 of the second P-type transistor M2, the P-type doped region (n+) 922 is a drain terminal D2 of the second P-type transistor M2, the P-type doped region (p+) 921 is a source terminal S of the second P-type transistor M2, and the N-type doped region (n+) 925 is a body terminal B of the second P-type transistor M2. The source terminal S of the first P-type transistor M1, the source terminal S of the second P-type transistor M2, the body terminal B of the first P-type transistor M1 and the body terminal B of the second P-type transistor M2 are connected with each other.

In this embodiment, each memory cell is constructed in the isolated well region. Consequently, the isolated well regions of different memory cells may receive different bias voltages. By providing proper bias voltages, hot carriers can be injected into one of the sidewall insulator 916 of the first P-type transistor M1 and the sidewall insulator 636 of the second P-type transistor M2. Consequently, the differential memory cell is in one of plural different storage state. For example, the hot carriers are electrons.

In other words, the sidewall insulators 916 and 936 are used as the trapping layers of the memory cell for storing the electrons. Consequently, the non-volatile memory (NVM) of the present invention is a charge-trapping non-volatile memory.

FIGS. 10A~10F schematically illustrate the bias voltages for performing different actions on the memory cell according to the THIRD embodiment of the present invention.

Figure 10A:
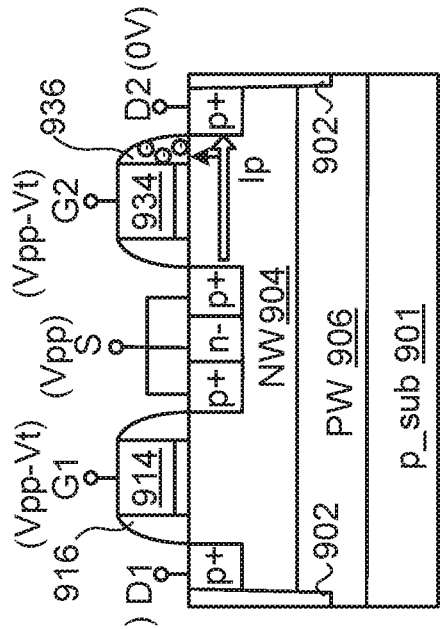
FIGS. 10A-10F schematically illustrate the bias voltages for performing different actions on the memory cell according to the THIRD embodiment of the present invention.

Please refer to FIG. 10A. For programming the memory cell into a first storage state, the source terminal S of the first P-type transistor M1 and the source terminal S of the second P-type transistor M2 receive a program voltage Vpp, the drain terminal D1 of the first P-type transistor M1 receives ground voltage (0V), the drain terminal D2 of the second P-type transistor M2 is in a floating state, the gate terminal G1 of the first P-type transistor M1 receives a first control voltage (Vpp–Vt), the second gate terminal G2 of the second P-type transistor M2 receives the ground voltage (0V), and the P-type well region (PW) 906 and P-type substrate (p_sub) 901 receive ground voltage (0V). For example, the program voltage Vpp is about 9V, on voltage (Von) is the ground voltage (0V), the first control voltage is equal to about (Vpp–Vt), and Vt is a threshold voltage of the P-type transistor, wherein Vt is about 1.5V.

As shown in FIG. 10A, the first P-type transistor M1 is turned on, and the second P-type transistor M2 is turned off. Consequently, a program current Ip is generated between the source terminal S and the drain terminal D1 of the first P-type transistor M1, but no program current is generated between the source terminal S and the drain terminal D2 of the second transistor M2. Due to a channel hot electron effect (also referred as a CHE effect), electrons are injected into one side of the sidewall insulator 916. For example, the electrons are injected into the sidewall insulator 916 on the drain side of the drain terminal D1 of the first P-type transistor M1. Consequently, the memory cell is programmed to the first storage state.

Figure 10B:
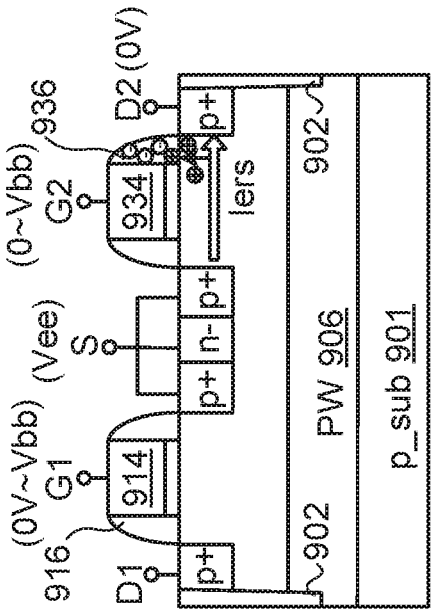

Please refer to FIG. 10B. For programming the memory cell into a second storage state, the source terminal S of the first P-type transistor M1 and the source terminal S of second P-type transistor M2 receive a program voltage Vpp, the drain terminal D1 of the first P-type transistor M1 is in the floating state, the drain terminal D2 of the second P-type transistor M2 receives the ground voltage (0V), the gate terminal G1 of the first P-type transistor M1 receives the ground voltage (0V), the second gate terminal G2 of the second P-type transistor M2 receives the first control voltage (Vpp–Vt), and the P-type well region (PW) 906 and the P-type substrate (p_sub) 901 receive the ground voltage (0V).

As shown in FIG. 10B, the second P-type transistor M2 is turned on, and the first P-type transistor M1 is turned off. Consequently, a program current Ip is generated between the source terminal S and the drain terminal D2 of the second transistor M2, but no program current is generated between the source terminal S and the drain terminal D1 of the first P-type transistor M1. Due to a channel hot electron effect (also referred as a CHE effect), electrons are injected into the sidewall insulator 936 on the drain side of the drain terminal D2 of the second P-type transistor M2. Consequently, the memory cell is programmed to the second storage state.

During an erase action, the electrons can be controlled to be ejected from the sidewall insulators 916 and 936, or the electrons can be combined with holes. Two examples of the erase action will be described as follows.

Figure 10C:
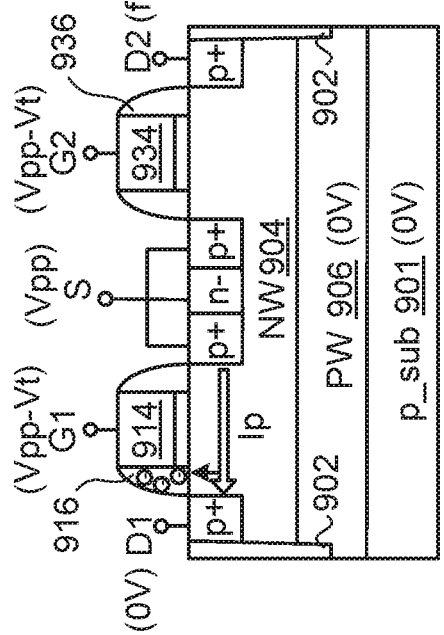

Please refer to FIG. 10C. During the erase action, the source terminals S of the first P-type transistor M1 and the source terminals S of the source terminals S of the second P-type transistor M2 receive an erase voltage Vee, the drain terminal D1 of the first P-type transistor M1 and the drain terminal D2 of the second P-type transistor M2 receive the erase voltage Vee, the gate terminal G1 of the first P-type transistor M1 and the second gate terminal G2 of the second P-type transistor M2 receive a second control voltage Vbb, and the P-type well region (PW) 906 and the P-type substrate (p_sub) 901 receive the ground voltage (0V). For example, the erase voltage Vee is about 12V, and the second control voltage Vbb is a negative voltage, e.g., about −5V.

Please refer to FIG. 10C again. In case that the memory cell is in the first storage state, a Fowler-Nordheim tunneling effect (i.e., a FN tunneling effect) is generated in the region between the gate terminal G1 of the first P-type transistor M1 and the N-type well region (NW) 904. Due to the FN tunneling effect, the electrons are ejected from the sidewall insulator 916 to the N-type well region (NW) 904 and exited from the first P-type transistor M1 through the body terminal B. Similarly, in case that the memory cell is in the first storage state, a Fowler-Nordheim tunneling effect (i.e., a FN tunneling effect) is generated in the region between the gate terminal G2 of the second P-type transistor M2 and the N-type well region (NW) 904. Due to the FN tunneling effect, the electrons are ejected from the sidewall insulator 936 to the N-type well region (NW) 904 and exited from the second P-type transistor M2 through the body terminal B.

Figure 10D:
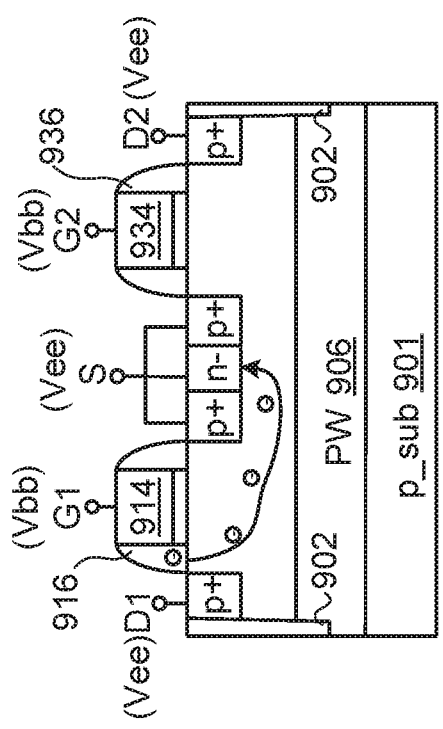

Please refer to FIG. 10D. During the erase action, the source terminals S of the first P-type transistor M1 and the source terminals S of the source terminals S of the second P-type transistor M2 receive an erase voltage Vee, the drain terminal D1 of the first P-type transistor M1 and the drain terminal D2 of the second P-type transistor M2 receive the ground voltage (0V), the gate terminal G1 of the first P-type transistor M1 and the second gate terminal G2 of the second P-type transistor M2 receive a third control voltage (0V~Vbb), and the P-type well region (PW) 906 and the P-type substrate (p_sub) 901 receive the ground voltage (0V). For example, the third control voltage is in the range between 0V and the second control voltage Vbb, and the second control voltage Vbb is a negative voltage, e.g., about −5V.

Please refer to FIG. 10D again. In case that the memory cell is in the second storage state, the first P-type transistor M1 and the second P-type transistor M2 are turned on. An erase current Iers is generated between the source terminal S of the second P-type transistor M2 and the drain terminal D2 of the second P-type transistor M2. Due to the channel hot hole effect (also referred as a CHH effect), the holes are injected into the sidewall insulator 936 to neutralize the electrons. Consequently, the memory cell is erased. Similarly, in case that the memory cell is in the first storage state, an erase current Iers is generated between the source terminal S of the first P-type transistor M1 and the drain terminal D1 of the first P-type transistor M1. Due to the channel hot hole effect (also referred as a CHH effect), the holes are injected into the sidewall insulator 916 to neutralize the electrons.

During a read action, the source terminals S of the first P-type transistor M1 and the source terminals S of the second P-type transistor M2 receive a read voltage Vr, the drain terminal D1 of the first P-type transistor M1 and the drain terminal D2 of the second P-type transistor M2 receive the ground voltage (0V), the gate terminal G1 of the first P-type transistor M1 and the second gate terminal G2 of the second P-type transistor M2 receive a fourth control voltage, and the P-type well region (PW) 906 and the P-type substrate (p_sub) 901 receive the ground voltage (0V). For example, the fourth control voltage is the ground voltage (0V), and the read voltage Vr is about 3V.

Figure 10E:
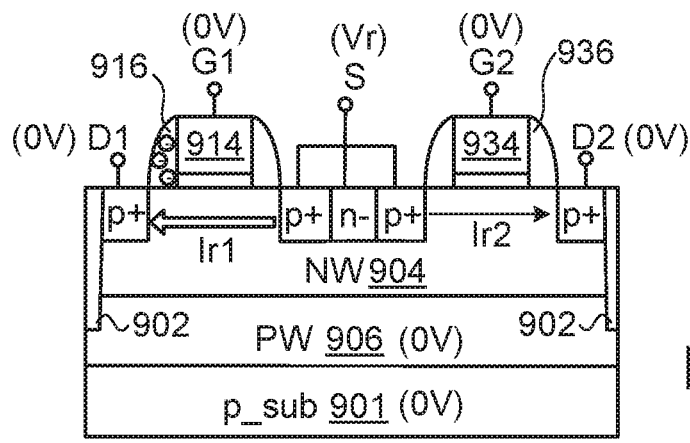

Please refer to FIG. 10E. During the read action, the first P-type transistor M1 and the second P-type transistor M2 are turned on.

Since electrons are stored in the sidewall insulator 916 but no electrons are stored in the sidewall insulator 936, a first read current Ir1 with the higher voltage value is generated between the source terminal S of the first P-type transistor M1 and the drain terminal D1 of the first P-type transistor M1 and a second read current Ir2 with the lower current value is generated between the source terminal S of the second P-type transistor M2 and the drain terminal D2 of the second P-type transistor M2. Since the first read current Ir1 is higher than the second read current Ir2, it is judged that the memory cell is in the first storage state.

Figure 10F:
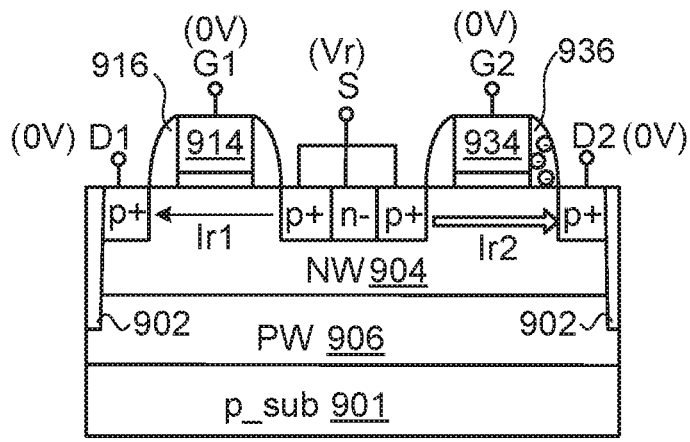

Please refer to FIG. 10F. Since no electrons are stored in the sidewall insulator 916 but electrons are stored in the sidewall insulator 936, the second read current Ir2 with the higher current value is generated between the source terminal S of the second P-type transistor M2 and the drain terminal D2 of the second P-type transistor M2, and the first read current Ir1 with the lower voltage value is generated between the source terminal S of the first P-type transistor M1 and the drain terminal D1 of the first P-type transistor M1. Since the second read current Ir2 is higher than the first read current Ir1, it is judged that the memory cell is in the second storage state.

It is noted that the voltage values of the program voltage Vpp, the erase voltage Vee, the read voltage Vr the second control voltage Vbb, and the fourth control voltage are not restricted. That is, these voltage values may be varied according to the practical requirements.

It is noted that the structure of the memory cell is not restricted to the structure as shown in FIG. 9A. For example, the structure of the substrate region or the P-type well region (PW) 906 may be modified by referring to the example of FIGS. 3A and 3B.

Figure 11:
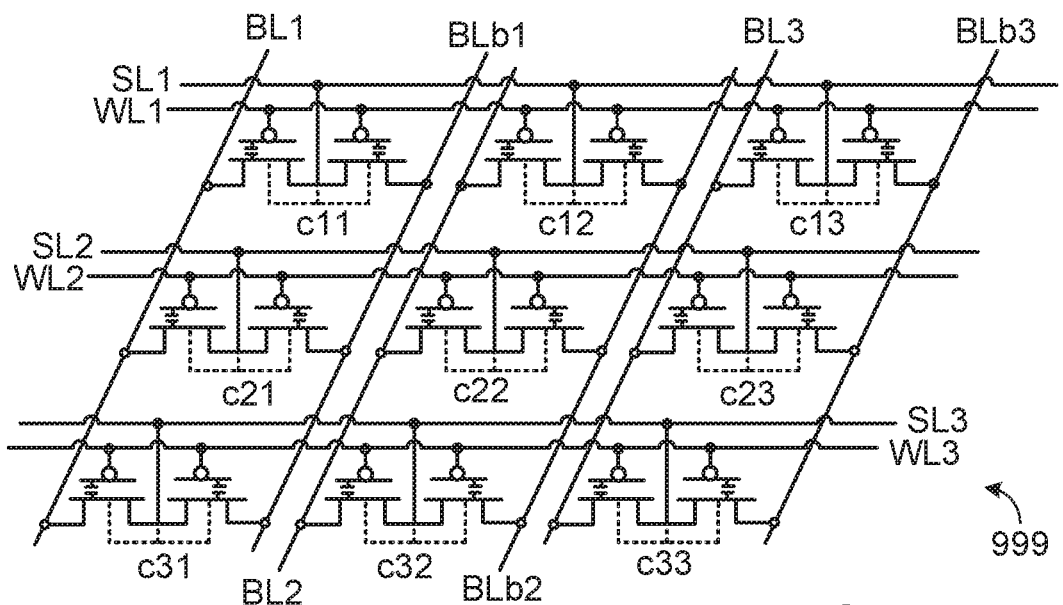
FIG. 11 is a schematic circuit diagram illustrating a memory cell array with plural memory cells of the third embodiment.

Moreover, plural memory cells of the third embodiment can be formed as a memory cell array. FIG. 11 is a schematic circuit diagram illustrating a memory cell array with plural memory cells of the third embodiment. The memory cell array 999 comprises m×n memory cells, wherein m and n are positive integers. For illustration, the memory cell array 999 of this embodiment comprises 3×3 memory cells c11~33. Each of the resistive memory cells c11~33 comprises a first P-type transistor and a second P-type transistor.

In the memory cell array 999, the first gate terminals and the second gate terminals of the three memory cells c11~c13 in the first row are all connected with the word line WL1, the source terminals of the first P-type transistors and the second P-type transistors in the three memory cells c11~c13 are all connected with the source line SL1, and the drain terminals of the first P-type transistors and the second P-type transistors in the three memory cells c11~c13 are respectively connected with the bit lines BL1, BL2, BL3 and the inverted bit lines BLb1, BLb2, BLb3. The first gate terminals and the second gate terminals of the three memory cells c21~c23 in the second row are all connected with the word line WL2, the source terminals of the first P-type transistors and the second P-type transistors in the three memory cells c21~c23 are all connected with the source line SL2, and the drain terminals of the first P-type transistors and the second P-type transistors in the three memory cells c21~c23 are respectively connected with the bit lines BL1, BL2, BL3 and the inverted bit lines BLb1, BLb2, BLb3. The rest may be deduced by analogy.

Whenever the memory cell array 999 is enabled, one word line is activated. The row of the memory cell array 999 corresponding to the activated word line is referred as a selected row. The rows of the memory cell array 999 corresponding to the other word lines are unselected rows. Similarly, for performing the program action, the erase action or the read action, proper bias voltages as described in FIGS. 10A-10F may be provided to the memory cell array 999.

From the above descriptions, the present invention provides a charge-trapping non-volatile memory. Each memory cell in the non-volatile memory is constructed in an isolated well region. Consequently, a program action, an erase action and a read action can be performed on any memory cell of the non-volatile memory. Furthermore, the sidewall insulator of the memory cell is used for trapping hot carriers. That is to say, the electrons are trapped in one side of the sidewall insulator when the program action is performed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory comprising a first memory cell, the first memory cell comprising:
   a substrate region;
   a barrier layer formed over the substrate region;
   an N-type well region formed over the barrier layer;
   an isolation structure arranged around the N-type well region, and formed over the barrier layer, wherein the isolation structure has a first depth, the N-type well region has a second depth, and the second depth is smaller than the first depth, wherein the N-type well region is surrounded by the isolation structure and the barrier layer, so that the N-type well region is an isolated well region;
   a first gate structure formed over a surface of the N-type well region, wherein the first gate structure comprises a first gate oxide layer and a first gate electrode layer;
   a first sidewall insulator formed around the first gate structure;
   a first P-type doped region and a second P-type doped region formed under the surface of the N-type well region, and located on two sides of the first sidewall insulator, respectively; and
   an N-type doped region formed under the surface of the N-type well region,
   wherein the N-type well region, the first P-type doped region, the second P-type doped region, the N-type doped region and the first gate electrode layer are collaboratively formed as a first P-type transistor, a first gate terminal of the first P-type transistor is connected with the first gate electrode layer, a first source terminal of the first P-type transistor is connected with the first P-type doped region, a first drain terminal of the first P-type transistor is connected with the second P-type doped region, a first body terminal of the first P-type transistor is connected with the N-type doped region, and the first source terminal of the first P-type transistor and the first body terminal of the first P-type transistor are connected with each other.

2. The non-volatile memory as claimed in claim 1, wherein the non-volatile memory further comprises a second memory cell, and the second memory cell comprises a second P-type transistor, wherein the first gate terminal of the first P-type transistor is connected with a first word line, a second gate terminal of the second P-type transistor is connected with a second word line, the first source terminal of the first P-type transistor and a second source terminal of the second P-type transistor are connected with a first source line, and the first drain terminal of the first P-type transistor and a second drain terminal of the second P-type transistor are connected with a first bit line.

3. The non-volatile memory as claimed in claim 2, wherein the non-volatile memory further comprises a third memory cell, and the third memory cell comprises a third P-type transistor, wherein a third gate terminal of the third P-type transistor is connected with the first word line, a third source terminal of the third P-type transistor is connected with a second source line, and a third drain terminal of the third P-type transistor is connected to a second bit line.

4. The non-volatile memory as claimed in claim 1, wherein the non-volatile memory further comprises a second memory cell, and the second memory cell comprises a second P-type transistor, wherein the first gate terminal of the first P-type transistor is connected with a first word line, a second gate terminal of the second P-type transistor is connected with a second word line, the first source terminal of the first P-type transistor and a second source terminal of the second P-type transistor are connected with a first source line, the first drain terminal of the first P-type transistor is connected with a first bit line, and a second drain terminal of the second P-type transistor is connected with a second bit line.

5. The non-volatile memory as claimed in claim 4, wherein the non-volatile memory further comprises a third memory cell, and the third memory cell comprises a third P-type transistor, wherein a third gate terminal of the third P-type transistor is connected with the first word line, a third source terminal of the third P-type transistor is connected with a second source line, and a third drain terminal of the third P-type transistor is connected with the first bit line.

6. The non-volatile memory as claimed in claim 1, wherein the barrier layer is a P-type well region or a barrier oxide layer.

7. The non-volatile memory as claimed in claim 1, wherein the substrate region comprises a P-type substrate and an N-type buried layer, wherein the N-type buried layer is arranged between the P-type substrate and the barrier layer.

8. The non-volatile memory as claimed in claim 1, wherein the first sidewall insulator is a spacer, and the spacer is a silicon nitride spacer or a tri-layer oxide-nitride-oxide spacer.

9. The non-volatile memory as claimed in claim 1, wherein during a program action, a program voltage is provided to the first source terminal of the first P-type transistor, a ground voltage is provided to the first drain terminal of the first P-type transistor, and a first control voltage is provided to the first gate terminal of the first P-type transistor.

10. The non-volatile memory as claimed in claim 1, wherein during an erase action, an erase voltage is provided to the first source terminal of the first P-type transistor, the erase voltage is provided to the first drain terminal of the first P-type transistor, and a second control voltage is provided to the first gate terminal of the first P-type transistor, wherein the second control voltage is a negative voltage.

11. The non-volatile memory as claimed in claim 1, wherein during an erase action, an erase voltage is provided to the first source terminal of the first P-type transistor, a ground voltage is provided to the first drain terminal of the first P-type transistor, and a third control voltage is provided to the first gate terminal of the first P-type transistor, wherein the third control voltage is lower than or equal to the ground Voltage.

12. The non-volatile memory as claimed in claim 1, wherein the first memory cell further comprises:
a second gate structure formed over the surface of the N-type well region, wherein the second gate structure comprises a second gate oxide layer and a second gate electrode layer;
a second sidewall insulator formed around the second gate structure; and
a third P-type doped region and a fourth P-type doped region formed under the surface of the N-type well region, and located on two sides of the second sidewall insulator, respectively,
wherein the N-type well region, the third P-type doped region, the fourth P-type doped region, the N-type doped region and the second gate electrode layer are collaboratively formed as a second P-type transistor, a second gate terminal of the second P-type transistor is connected with the second gate electrode layer, a second source terminal of the second P-type transistor is connected with the third P-type doped region, a second drain terminal of the second P-type transistor is connected with the fourth P-type doped region, a second body terminal of the second P-type transistor is connected with the N-type doped region, and the second source terminal of the second P-type transistor and the second body terminal of the second P-type transistor are connected with each other.

13. The non-volatile memory as claimed in claim 12, wherein the non-volatile memory further comprises a second memory cell, and the second memory cell comprises a third P-type transistor and a fourth P-type transistor, wherein the first gate terminal of the first P-type transistor and the second gate terminal of the second P-type transistor are connected with a first word line, the first source terminal of the first P-type transistor and the second source terminal of the second P-type transistor are connected with a first source line, a third gate terminal of the third P-type transistor and a fourth gate terminal of the fourth P-type transistor are connected with a second word line, a third source terminal of the third P-type transistor and a fourth source terminal of the fourth P-type transistor are connected with a second source line, the first drain terminal of first P-type transistor and a third drain terminal of the third P-type transistor are connected with a first bit line, and the second drain terminal of the second P-type transistor and a fourth drain terminal of the fourth P-type transistor is connected with a first inverted bit line.

14. The non-volatile memory as claimed in claim 13, wherein the non-volatile memory further comprises a third memory cell, and the third memory cell comprises a fifth P-type transistor and a sixth P-type transistor, wherein a fifth gate terminal of the fifth P-type transistor and a sixth gate terminal of the sixth P-type transistor are connected with the first word line, a fifth source terminal of the fifth P-type transistor and a sixth source terminal of the sixth P-type transistor are connected with the first source line, a fifth drain terminal of the fifth P-type transistor is connected with a second bit line, and a sixth drain terminal of the sixth P-type transistor is connected with a second inverted bit line.

15. The non-volatile memory as claimed in claim 1, wherein the first memory cell further comprises:
a second gate structure formed over the surface of the N-type well region, wherein the second gate structure comprises a second gate oxide layer and a second gate electrode layer;
a second sidewall insulator formed around the second gate structure; and
a third P-type doped region and the second P-type doped region formed under the surface of the N-type well region, and located on two sides of the second sidewall insulator, respectively,
wherein the N-type well region, the second P-type doped region, the third P-type doped region, the N-type doped region and the second gate electrode layer are collaboratively formed as a second P-type transistor, a second gate terminal of the second P-type transistor is connected with the second gate electrode layer, a second source terminal of the second P-type transistor is connected with the second P-type doped region, a second drain terminal of the second P-type transistor is connected with the third P-type doped region, and a second body terminal of the second P-type transistor is connected with the N-type doped region.

16. The non-volatile memory as claimed in claim 15, wherein the non-volatile memory further comprises a second memory cell, and the second memory cell comprises a third P-type transistor and a fourth P-type transistor, wherein the first gate terminal of the first P-type transistor is connected with a first control line, the first source terminal of the first P-type transistor is connected with a first source line, the first drain terminal of the first P-type transistor is connected with the second source terminal of the second P-type transistor, the second drain terminal of the second P-type transistor is connected with a first bit line, the second gate terminal of the second P-type transistor is connected with a first word line, a third gate terminal of the third P-type transistor is connected with the first control line, a third source terminal of the third P-type transistor is connected with the first source line, a third drain terminal of the third P-type transistor is connected with a fourth source terminal of the fourth P-type transistor, a fourth drain terminal of the fourth P-type transistor is connected with a second bit line, and a fourth gate terminal of the fourth P-type transistor is connected with a second word line.

17. The non-volatile memory as claimed in claim 16, wherein the non-volatile memory further comprises a third memory cell, and the third memory cell comprises a fifth P-type transistor and a sixth P-type transistor, wherein a fifth gate terminal of the fifth P-type transistor is connected with a second control line, a fifth source terminal of the fifth P-type transistor is connected with the first source line, a fifth drain terminal of the fifth P-type transistor is connected with a sixth source terminal of the sixth P-type transistor, a sixth drain terminal of the sixth P-type transistor is connected with the first bit line, and a sixth gate terminal of the sixth P-type transistor is connected with the first word line.

18. The non-volatile memory as claimed in claim 15, wherein during a program action, a program voltage is provided to the first source terminal of the first P-type transistor, a ground voltage is provided to the second drain terminal of the second P-type transistor, an on voltage is provided to the first gate terminal of the first P-type transistor, and a first control voltage is provided to the second gate terminal of the second P-type transistor.

19. The non-volatile memory as claimed in claim 15, wherein during an erase action, an erase voltage is provided to the first source terminal of the first P-type transistor, the erase voltage is provided to the second drain terminal of the second P-type transistor, a second control voltage is provided to the first gate terminal of the first P-type transistor, and a second control voltage is provided to the second gate terminal of the second P-type transistor, wherein the second control voltage is a negative voltage.

20. The non-volatile memory as claimed in claim 15, wherein during an erase action, an erase voltage is provided to the first source terminal of the first P-type transistor, a ground voltage is provided to the second drain terminal of the second P-type transistor, an on voltage is provided to the first gate terminal of the first P-type transistor, and a third control voltage is provided to the second gate terminal of the second P-type transistor, wherein the third control voltage is lower than or equal to the ground voltage.

* * * * *